United States Patent [19]

Martin et al.

[11] 4,309,676
[45] Jan. 5, 1982

[54] INSTANTANEOUS COMPRESSOR AND INSTANTANEOUS EXPANDOR

[75] Inventors: Hubert Martin, Salt Lake City, Utah; Gerald W. Beene, Arlington, Tex.

[73] Assignee: Reliance Electric Company, Bedford, Tex.

[21] Appl. No.: 185,892

[22] Filed: Sep. 10, 1980

[51] Int. Cl.³ .............................................. H04B 1/64
[52] U.S. Cl. ...................................... 333/14; 330/284; 370/7; 375/34; 333/217
[58] Field of Search ...................... 307/264; 330/284; 333/14; 370/7; 375/24, 34; 455/72

[56] References Cited

U.S. PATENT DOCUMENTS

| | | | |
|---|---|---|---|
| 3,176,224 | 3/1965 | Lampke | 325/38 |
| 3,466,572 | 9/1969 | Hanna et al. | 330/284 X |
| 3,905,028 | 9/1975 | Wintz et al. | 340/347 AD |
| 4,220,875 | 9/1980 | Lawton | 333/14 X |

Primary Examiner—Paul L. Gensler
Attorney, Agent, or Firm—Michael M. Rickin

[57] ABSTRACT

An instantaneous compressor and an instantaneous expandor both of which use the logarithmic characteristics of diodes to provide compression and expansion, respectively, of uncompressed analog PAM signals and compressed analog PAM signals. Both the compressor and expandor also include circuitry having a temperature dependent gain characteristic. The signal at the compressor output is a temperature independent compressed analog signal which follows the compressor's logarithmic encoding characteristic. The signal at the output of the expandor is a temperature independent uncompressed analog signal which is substantially identical to the analog signal at the compressor input.

32 Claims, 7 Drawing Figures

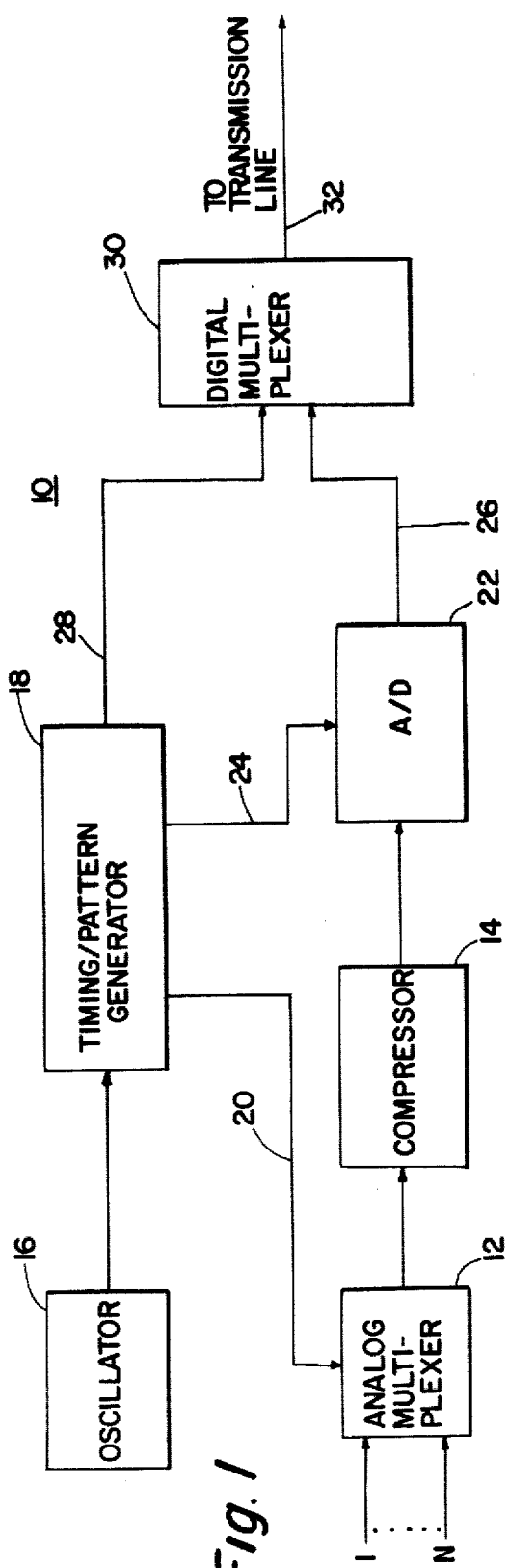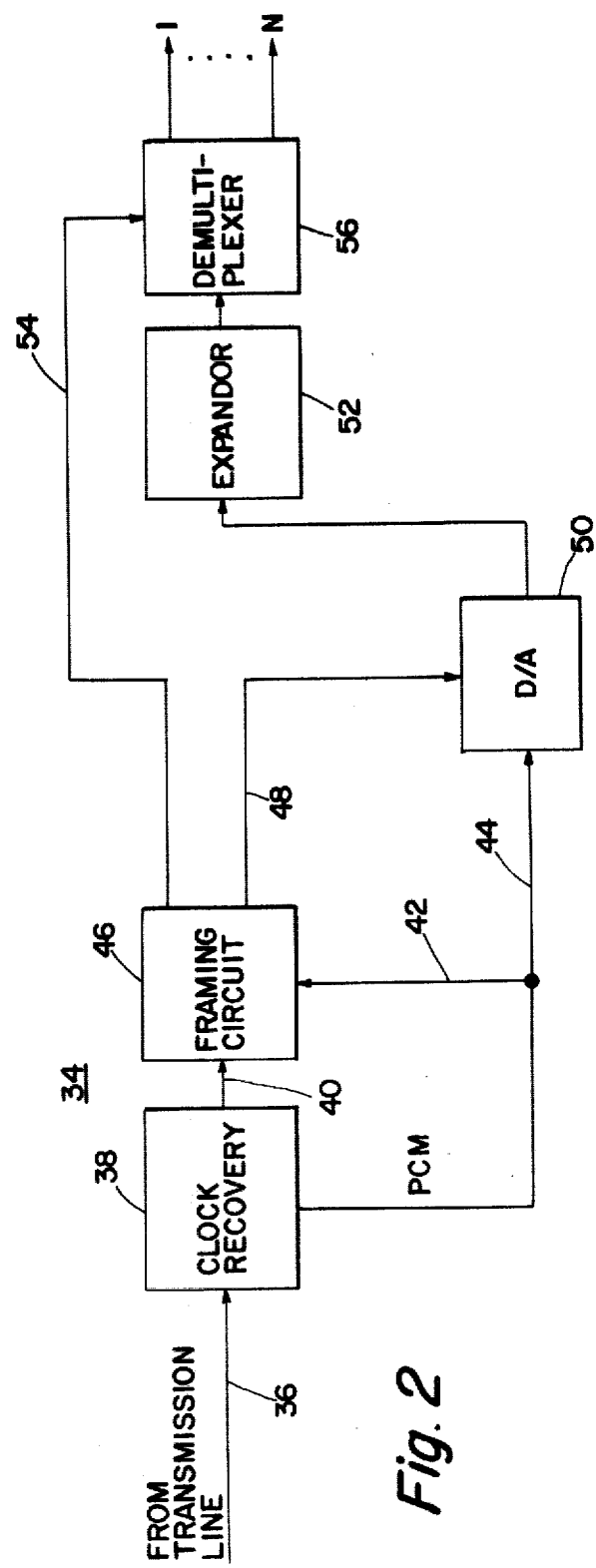

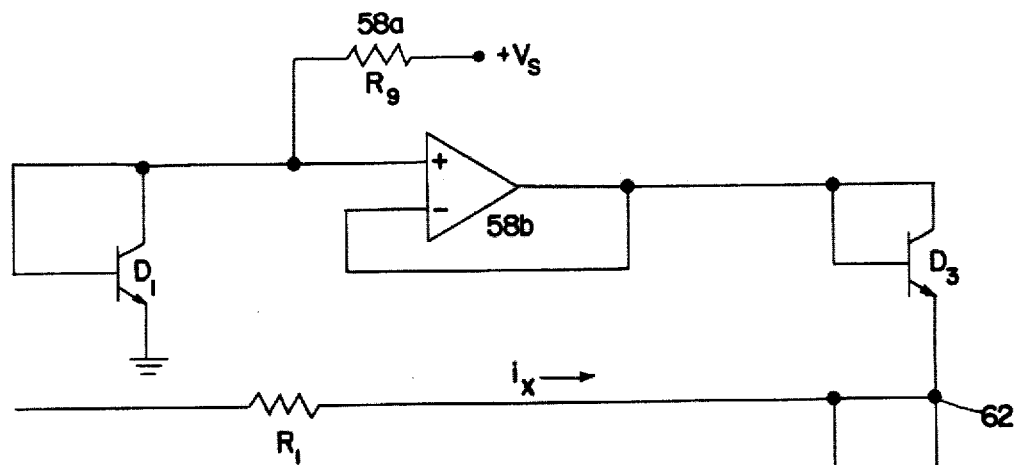
Fig. 4
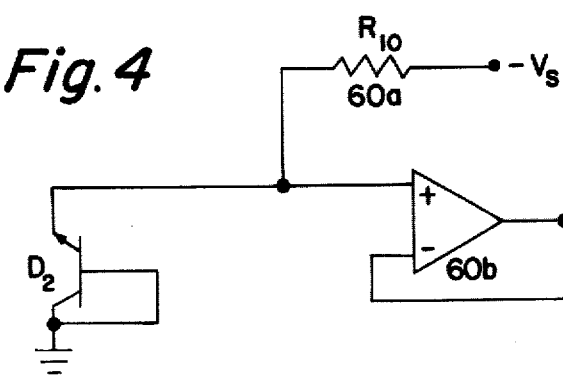
Fig. 6
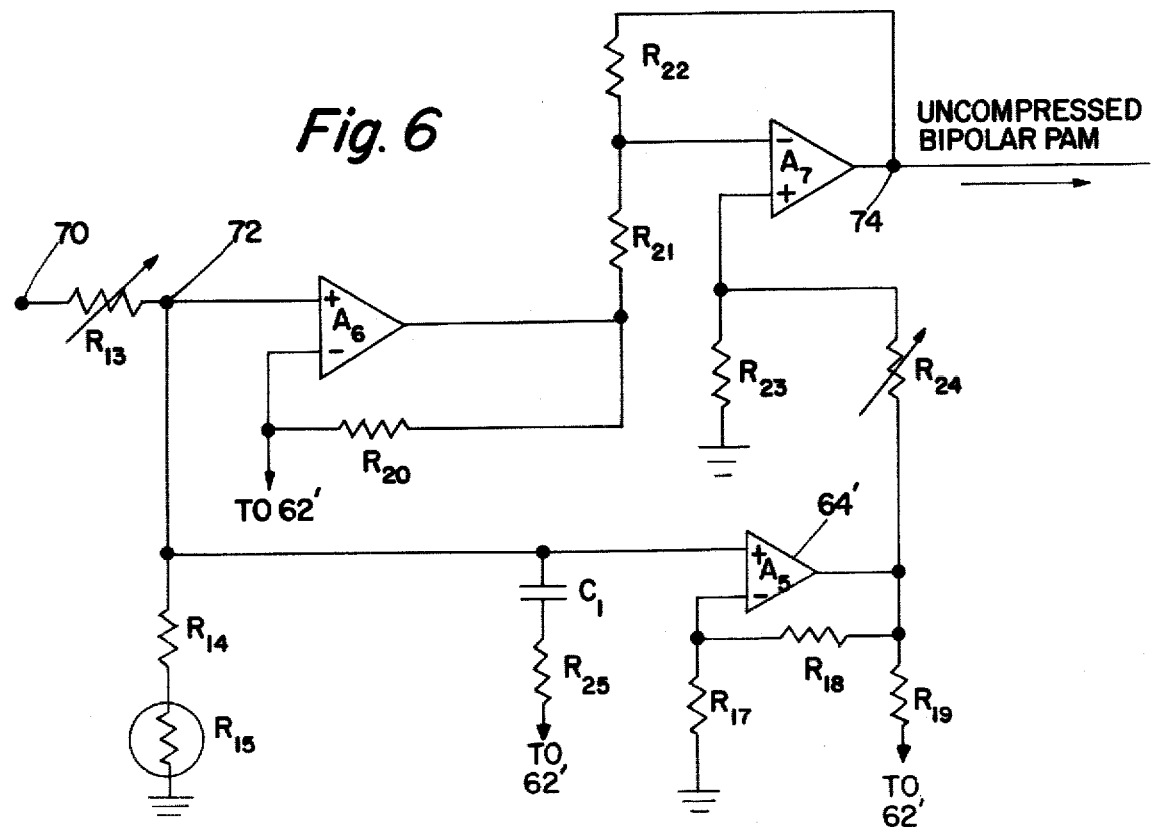

INSTANTANEOUS COMPRESSOR AND INSTANTANEOUS EXPANDOR

BACKGROUND OF THE INVENTION

1. Field of the Invention

The present invention relates to circuitry for providing compression of uncompressed analog PAM signals and expansion of compressed analog PAM signals and more particularly to those instantaneous compressors and expandors which utilize the logarithmic characteristics of diodes to provide such compression and expansion.

2. Description of the Prior Art

In PCM (pulse code modulation) communication systems, continuous time varying information signals, such as electrical speech signals, may be represented by a series of on and off pulses. At a transmitting station the signal is periodically sampled, quantized, and encoded into binary code words which are indicative of the amplitude of the signal. The binary coded signals are then transmitted over a medium such as a telephone transmission line to a receiving station. At the receiving station the binary code words are decoded and reconverted back to continuous time varying information signals.

When the signal is quantized for transmission the difference between the instantaneous value of the signal and the quantum level actually transmitted gives rise to what is known as quantizing noise or quantizing distortion. This distortion is especially objectionable when the instantaneous value or magnitude of the input signal is small, but is usually of little or no significance when the instantaneous value of the signal is high. To reduce this distortion it is therefore desirable to have a nonlinear redistribution of the total number of quantizing levels available. This nonlinear redistribution is called "companding" which is a verbal contraction of the terms "compression" and "expansion."

At the transmitter companding is provided by a compression circuit which has a known compression characteristic. At the receiver the received companded signal is expanded by an expandor circuit having an expansion characteristic which is complementary to the compression characteristic to thereby provide overall linearity in the PCM system.

A current practice in the quantization of analog signals for transmission in telephone system applications is to encode the input signal logarithmically according to a "mu-law" companding scheme. Logarithmic mu-law encoding of signals provides reasonably constant signal to quantization noise levels over a wide dynamic range of input voice signals. Thus, logarithmic encoding is desirable for speech processing.

The mu-law encoding characteristic provides a smooth logarithmic curve over the range of input signal amplitude. The characteristic is usually implemented by circuitry which provides a piecewise linear approximate equivalent to the logarithmic characteristic. For example, a mu-225 code implies an encoding scheme that employs 8 positive and 8 negative segments (chords) to approximate the logarithmic characteristic. In practice, this is a 15 chord approximation law since the inner positive and innermost negative chords are colinear.

There have been many attempts in the prior art to provide circuitry for compressors and expandors which approximates the mu-law logarithmic characteristic. One such compandor circuit is described in U.S. Pat. No. 3,176,224 which issued on Mar. 30, 1965. The compandor circuit described therein utilizes ramp or slope functions which are generated or derived from, and in time sequence, with, the cyclic pulse repetition rate of the PCM system. The compression and expansion characteristics provided are parabolic rather than the ideal logarithmic configuration. This approach is utilized in order that the problems associated with earlier compressors and expandors which utilize the non-linear characteristics of diodes are eliminated. Compandors utilizing the nonlinear characteristics of diodes exhibited signal degradation due to nonuniformity of the temperature stability properties and/or the characteristic curves of the diodes used at each end of the transmission circuit. Among the techniques used in the prior art to provide temperature stability are the placement of the diodes in ovens designed to provide a substantially constant diode operating temperature.

Another attempt to provide an encoder for the mu-law characteristic is described in U.S. Pat. No. 3,905,028 which issued on Sept. 9, 1975. The encoder described therein utilizes a minimal amount of analog circuitry in conjunction with digital components to directly convert analog signals into a code exhibiting logarithmic characteristics. Still more recent attempts to provide encoders and decoders having logarithmic characteristics has resulted in the development of integrated circuits known as codecs which is a verbal contraction of the terms "encoder" and "decoder." A typical example of such a codec are the models DF 331 coder and DF 332 decoder both of which are manufactured by Siliconix of Santa Clara, Calif.

Present multichannel PCM Carrier for use in telephone systems is usually designed to meet a standard which specifies the number of bits to be transmitted per second and the type of companding characteristic and number of bits included therein. One such type of system is the $T_1 D_3$ system which has been put into effect by the American Telephone and Telegraph Company in their associated Bell operating companies. In this system 24 channels of binary coded information are transmitted at the rate of $1.544 \times 10^6$ bits per second. This system utilizes an 8 bit mu-255 companding characteristic. Each of the 24 channels are periodically sampled at an 8 kilohertz rate and the resultant samples are then quantized and encoded.

Codecs could be used in the above system to perform the quantizing and encoding steps at the transmitter and the decoding and conversion steps at the receiver. The basic building block of any codec is a companding analog to digital converter. There are, however, no companding analog to digital converters and thus no codecs which are fast enough to handle the encoding of all 24 channels by a single codec. The alternatives then are to utilize either one codec per channel or have a limited number of channels such as eight (8) share a codec. Neither of these approaches provide a cost effective solution to the problem of encoding and decoding 24 channels in a $T_1 D_3$ PCM system.

It was then recognized that it would be far more desirable to provide a single analog compandor for the compression and expansion of the 24 channels. It was further recognized that such a compandor could be simply and cost effectively provided utilizing the logarithmic characteristics of diodes in order to provide an approximation to the mu-255 characteristic. The analog compandor of the present invention in conjunction with linear encoding after the compressor and linear decoding before the expandor provides the approximation to the mu-255 characteristic through the use of the logarithmic characteristics of diodes. The compandor of the present invention also substantially eliminates the problems associated with earlier compressors and expandors which used the nonlinear characteristic of diodes to approximate the companding characteristic.

SUMMARY OF THE INVENTION

In accordance with the present invention there is provided both an instantaneous compressor and an instantaneous expandor. Both the compressor and the expandor use the logarithmic characteristics of diodes to provide at the compressor output a temperature independent compressed analog signal which follows the compressor's logarithmic encoding characteristic and at the expandor output an uncompressed temperature independent analog signal which is substantially identical to the analog signal present at the compressor input.

The compressor includes a first source which includes a first conductive device having a temperature dependent logarithmic conduction characteristic. The first source generates a constant amplitude first current and the first conductive device generates a first voltage in response thereto. A first circuit generates at a junction point intermediate the compressor input and output a second current which is equal to the first current when the input signal is zero. A signal proportional to the compressor input signal appears at the junction and a second conductive device which is matched to the first conductive device generates in response to the junction signal and the second current a second voltage. The voltage at the junction is temperature dependent and is the difference between the first and second voltages. A circuit having a temperature sensitive gain characteristic responds to the junction voltage to generate at the compressor output the temperature independent compressed analog signal.

The expandor includes a first source and a first circuit both arranged in a fashion and functioning in a manner similar to the corresponding parts of the compressor. A circuit having a temperature dependent gain characteristic is connected between the input and the junction to generate at the junction a temperature dependent voltage proportional to the expandor input voltage. A second conductive device matched to the first conductive device is connected between the first source and the junction. The second device generates, when the input is zero, a voltage which is equal and opposite to the voltage generated by the first device and in response to the temperature dependent junction voltage a current such that a circuit responsive to the current and the temperature dependent junction voltage generates the expandor output signal.

DESCRIPTION OF THE DRAWING

FIG. 1 is a block diagram of a typical transmitter for converting analog speech signals to time division multiplex signals.

FIG. 2 is a block diagram of a typical receiver for converting time division multiplex signals into analog speech signals.

FIG. 4 shows a detailed circuit schematic for the source means of FIG. 3.

FIG. 6 is a schematic diagram which illustrates an exemplary embodiment for a portion of the expandor shown in FIG. 5.

DESCRIPTION OF THE PREFERRED EMBODIMENT

Figure 3:
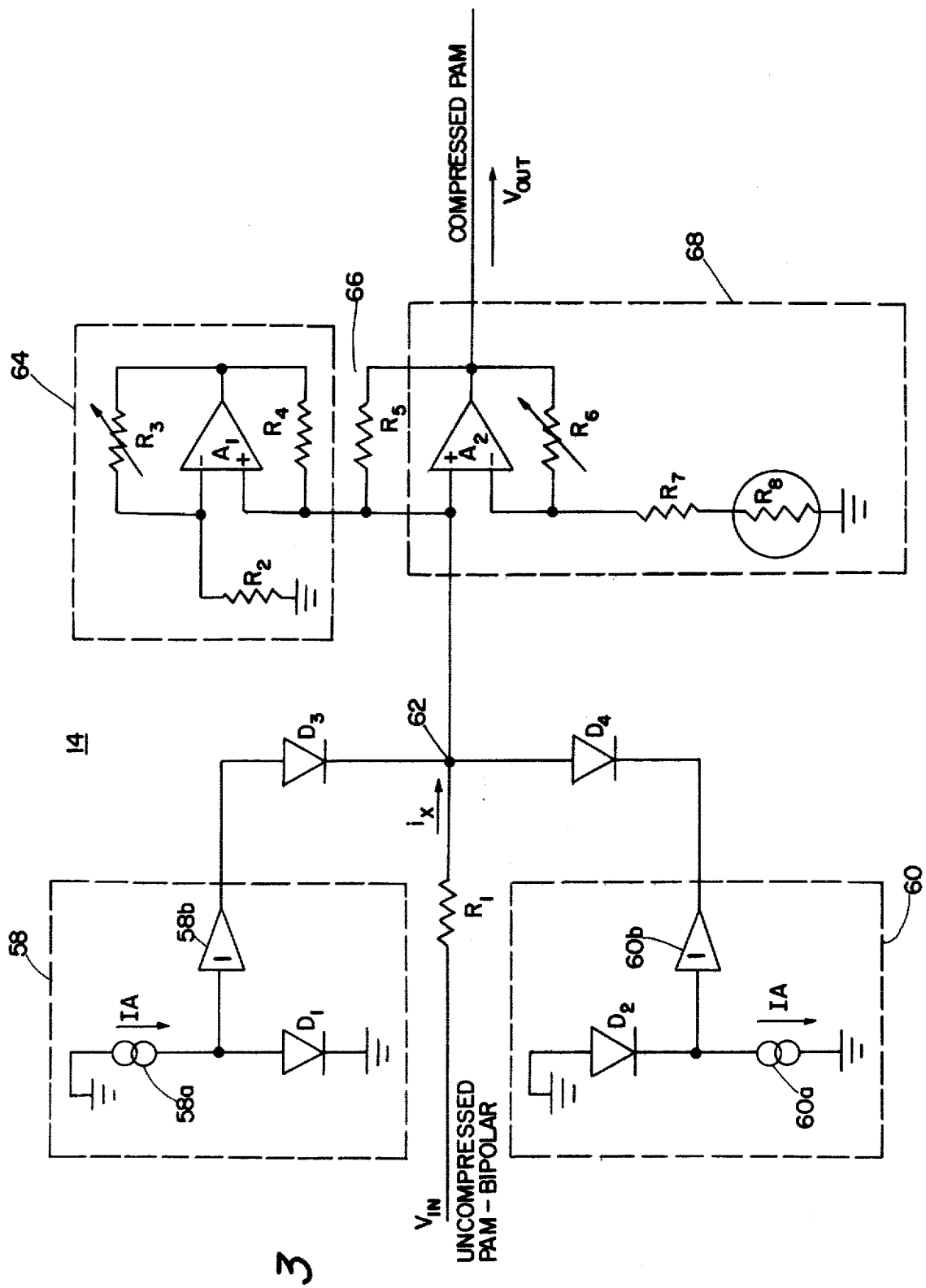
FIG. 3 is a schematic diagram which illustrates one embodiment of the invention as applied to a compressor for bipolar signals.

Referring to FIG. 1 there is shown a typical transmitter 10 including a compressor 14 for converting analog speech signals to a time division multiplexed signal for transmission over a transmission line. The analog signals from each speech channel is indicated by the arrows 1-N, wherein N is the maximum number of channels served by the transmitter. These speech signals are applied to analog multiplexer 12.

Multiplexer 12 serves to sample the signal in each of lines 1-N at a predetermined sampling rate and apply the resultant samples in the form of pulses to compressor 14. The predetermined sampling rate is generated by timing/pattern generator 18 from oscillator 16 and is applied to multiplexer 12 by line 20. For telephone transmission of voice signals the predetermined sampling rate is 8,000 times per second.

The amplitude of each sample pulse is proportional to the analog signal level at the instant of sampling. The pulse samples are commonly referred to as a pulse amplitude modulated (PAM) signal. As the signal being sampled is either positive or negative the corresponding pulse sample will be either positive or negative. Thus for each channel being sampled a sequence of positive and/or negative PAM signals will be generated. This signal will be referred to hereinafter as a bipolar PAM signal where the term bipolar is used to indicate that the pulse samples may be either positive or negative but should not be taken to mean that the samples need necessarily alternate in polarity.

Multiplexer 12 applies the bipolar PAM signals generated for each channel in sequence one channel and one pulse at a time to the input of compressor 14. Thus, the input signal to compressor 14 is a time multiplexed bipolar PAM signal.

The multiplexed signal is compressed by compressor 14 and applied to A/D converter 22. The amount by which the multiplexed PAM signal is compressed is dependent upon the compression characteristic of compressor 14. A/D converter 22 converts the compressed PAM signals into pulse code modulated (PCM) signals which appear on line 26. The timing for the operation of converter 22 is provided from oscillator 16 through generator 18 and is applied to converter 22 by line 24. The particular encoding provided by A/D converter 22 depends upon the type of PCM system utilized. For example the combination of compressor 14 and A/D converter 22 may provide on line 26 PCM signals which are in the $D_3$ format. This format is obtained by utilizing a compressor which follows the mu-225 compression characteristic and an A/D converter which converts the compressed PAM signal into an 8 bit PCM signal.

The PCM signals on line 26 are applied to digital multiplexer 30 where they are combined with various timing signals from generator 18. The timing signals are applied to multiplexer 30 by line 28 which connects the timing/pattern generator 18 to the multiplexer. One of the timing signals is the clock signal which determines the rate at which the bits comprising the PCM signal are transmitted. Multiplexer 30 time multiplexes the PCM signals with the timing signals to provide at its output a group of time multiplexed speech channels commonly called a frame. The number of channels comprising each frame depends on the type of PCM system utilized. The pulses which define the end of one frame and the beginning of the next frame are also obtained from the timing signals on line 28. Multiplexer 30 may also combine various types of signalling information (not shown) with the PCM speech signals and the framing information. The timing for the signalling information may also be obtained from the timing signals on line 28. Multiplexer 30 therefore provides at its output a time multiplexed PCM signal which combines speech, signalling and timing information. This time multiplexed signal is then applied by line 32 through a suitable line driver (not shown) to a transmission line for transmission to an associated receiving terminal.

Referring to FIG. 2, there is shown a typical receiver 34 including an expandor 52 for receiving from the transmission line the multi-channel time multiplexed PCM encoded speech signal and reconverting this signal into analog signals to be sent to the respective one of the message channels 1-N. The time multiplexed signal is received from the transmission line on line 36 and is applied to clock recovery circuit 38 which serves to extract timing information from the received signal. The extracted timing information ensures that the clock rate at the receiver is equal to the clock rate at the transmitter.

The clock signal is applied by line 40 to framing circuit 46 which extracts from the PCM signal on line 42 the timing information used to control D/A converter 50 and demultiplexer 56. The PCM speech signal is applied to D/A converter 50 by line 44. In combination with the timing information provided by line 48 from framing circuit 46, the D/A converter 50 decodes the PCM signal to provide a bipolar compressed PAM signal to expandor 52. The timing information on line 48 allows converter 50 to operate on and convert to an analog signal the exact number of bits associated with each channel's encoded speech sample. The PAM signal provided to expandor 52 is identical to the compressed PAM signal generated by compressor 14 of FIG. 1.

Expandor 52 has an expansion characteristic which is the complement of the compression characteristic of compressor 14 and thereby serves to expand the compressed PAM signal. The PAM signal at the output of expandor 52 is substantially identical to the PAM signal at the input to compressor 14, the only difference between the signal being the quantizing noise mentioned previously. Demultiplexer 56 serves to divide the expanded PAM signal into the analog signals to be provided to the respective message channels as indicated by the arrows 1-N. Framing circuit 46 serves to provide by line 54 the timing information for the demultiplexing operation.

The received PCM signal may also include signalling information for the channels. The signalling information may be recovered by suitable signal recovery circuitry (not shown) which operates in conjunction with timing signals provided by framing circuit 46.

Referring to FIG. 3 there is shown a simplified schematic diagram of the compressor 14 of FIG. 1 according to the present invention.

To the end that a compressed PAM signal may be generated from a bipolar uncompressed PAM signal, compressor 14 includes bias sources 58 and 60, diodes $D_3$ and $D_4$, negative resistance circuit 64, feedback circuit 66 and temperature compensation circuit 68. A detailed schematic diagram for bias sources 58 and 60 and diodes $D_3$ and $D_4$ is shown in FIG. 4 to be described hereinafter.

Bias sources 58 and 60 provide the bias for diodes $D_3$ and $D_4$, respectively. Source 58 serves to generate from current source 58a a current $I_A$. Source 60 serves to generate from current source 60a the current $I_A$. Amplifier 58b connected to the junction of source 58a and the anode of diode $D_1$ and amplifier 60b connected to the junction of source 60a and the cathode of diode $D_2$ are unity gain voltage followers. Each amplifier provides both a precise source of voltage and impedance isolation. Bias source 58 is connected to the anode of diode $D_3$ and bias source 60 is connected to the cathode of diode $D_4$. The cathode of diode $D_3$ and the anode of diode $D_4$ are connected together at junction 62. Uncompressed bipolar PAM speech signals from analog multiplexer 12 of FIG. 1 are also connected to junction 62 through resistor $R_1$.

Referring to FIG. 4 there is shown a detailed circuit diagram for bias sources 58 and 60 and diodes $D_3$ and $D_4$ of FIG. 3. Diodes $D_1$ and $D_2$ of sources 58 and 60 and diodes $D_3$ and $D_4$ are embodied by NPN transistors. The collector and base of each of the transistors are connected together and therefore each of the transistors operates in the same manner as a diode. The transistors utilized in embodying the diodes are selected in a manner such that the diodes are matched to each other. Matching of the diodes may be obtained by having the transistor elements located on the same integrated circuit chip, such as Motorola type MC 3346.

Current sources 58a and 60a are embodied by the resistors R9 and R10, respectively. Resistor R9 is connected to a source of positive d-c voltage $+V_s$ and resistor R10 is connected to a source of negative d-c voltage $-V_s$. Current source 58a generates a bias current which results in a voltage, VD1, occurring across diode D1. Current source 60a generates a bias current which results in a voltage, VD2, occurring across diode D2. The voltages VD1 and VD2 are always equal in magnitude and opposite in sign independent of whether or not uncompressed bipolar PAM signals appear at junction 62. Thus source 58a and source 60a each establish a fixed reference current and in turn a fixed reference voltage across their associated diodes which current and voltage remain constant and unaffected by any PAM signals appearing at junction 62.

In the absence of bipolar PAM speech signals at junction 62, sometimes referred to as an idle condition, the voltage at the junction is zero. In the idle condition the currents flowing through the diodes D3 and D4 are equal to the currents flowing through the diodes D1 and D2. Thus in the idle condition the voltages VD3 and VD4 developed across diodes D3 and D4 respectively, which as described above are matched to diodes D1 and D2, are also equal in magnitude and opposite in sign. The relationship between the voltages VD1, VD2, VD3 and VD4 may be expressed as:

$$VD1 + VD2 = VD3 + VD4 \qquad (1)$$

As the voltages VD1 and VD2 are always equal in magnitude and opposite in sign the above equation may also be used to express the relationship between the voltages VD1, VD2, VD3 and VD4 for the condition when bipolar PAM signals are present at junction 62.

The voltage, V, at junction 62 may be expressed as:

$$V = VD_4 - VD_2 = \frac{KT}{q} \ln\left(\frac{i_{D4}}{I_A + I_S}\right) \quad (2)$$

where
k is Boltzmann's constant
T is temperature in degrees Kelvin
q is the charge of an electron in Coulombs
$i_{D4}$ is the current which flows in D4 due to a signal
$I_A$ is the fixed bias current provided by sources 58a and 60a
$I_S$ is the reverse saturation current of the diode In the idle condition the current $I_S$ is zero and the current $i_{D4}$ is equal to $I_A$. Thus, in the idle condition the voltage at junction 62 is, as described above, zero.

The voltage, $V_C$, from the anode of diode D1 to the cathode of diode D2 which is also the same as the voltage from the anode of diode D3 to the cathode of diode D4 and may be expressed as:

$$V_C = \frac{KT}{q}\left[\ln\frac{i_{D3}}{I_S} + \ln\frac{i_{D4}}{I_S}\right] \quad (3)$$

$$= \frac{KT}{q} \ln\frac{i_{D3} \cdot i_{D4}}{I_S^2} \quad (3a)$$

As Vc is constant and independent of the signal at junction 62 the current through each of diodes D3 and D4 may be equated to $I_A$ thereby expressing $V_C$ as:

$$V_C = \frac{KT}{q} \ln\left(\frac{I_A}{I_S}\right)^2 \quad (3b)$$

As the signal current through diodes D3 and D4 is many times larger than the reverse saturation current it has been assumed in arriving at equations (2) and (3) that $$1 + \frac{i_{DN}}{I_S} \approx \frac{i_{DN}}{I_S}$$

When the positive going portion of the uncompressed bipolar PAM samples appears at resistor R1, an external current, $i_x$, flows into junction 62 such that the total currents $i_{D3}$ and $i_{D4}$ flowing in diodes D3 and D4 may be expressed as:

$$i_{D4} = i_{D3} + i_x \quad (4)$$

By equating like parts of equations (3a) and (3b) and substituting therein the relationship of equation (4) the current $i_{D4}$ may be expressed as a function of $I_A$ and $i_x$ in the following form:

$$i_{D4} = \frac{i_x}{2} \pm \frac{\sqrt{i_x^2 + 4I_A^2}}{2} \quad (5)$$

Substituting the above expression for $i_{D4}$ into equation (2) allows the voltage, V, at junction 62 in the presence of positive uncompressed PAM samples to be expressed as:

$$V = \frac{KT}{q} \ln \frac{i_x + i_x\sqrt{1 + \left(\frac{2I_A}{i_x}\right)^2}}{2I_A} \quad (6)$$

In arriving at the above equation it has been assumed that the bias current $I_A$ provided by sources 58a and 60a is much greater than the reverse saturation current, $I_S$, of the diodes D3 and D4, i.e. $I_A >> I_S$.

Equation (6) for the voltage at junction 62 in the presence of positive uncompressed PAM signals may also be used as the expression for the voltage at the junction in the presence of the negative going portion of the uncompressed bipolar PAM signals. By symmetry the voltage at junction 62 reverses in sign for negative uncompressed PAM signals.

For positive going PAM signals a signal current flows through resistor R1 and into junction 62. In the idle condition the current through the diodes D3 and D4 is equal to the currents through the diodes D1 and D2. The positive going PAM signal reduces the current in diodes D3 and increases the current in diode D4. The current flowing in diode D4 tends to rise toward the signal current and the current in diode D3 decreases. If the PAM signal current is sufficiently high diode D3 will be turned off. The voltage across diode D3 will decrease and the voltage across diode D4 will increase in the presence of positive going samples but the sum of the two voltages will always be constant and equal to the sum of the voltages across diodes D1 and D2. The currents flowing in diodes D3 and D4 in the presence of positive going signals are inversely related in that as the current in D4 doubles the current in D3 halves.

For negative going PAM signals a signal current flows out of junction 62 through resistor R1. The negative going sample reduces the current in diode D4 and increases the current in diode D3. The current flowing in D3 tends to rise toward the signal current and the current in D4 decreases. If the PAM signal current is sufficiently high diode D4 will be turned off. Thus operation of the diodes in the presence of negative going samples is identical to the diodes' operation in the presence of positive going samples with the exception that the roles of diodes D3 and D4 are reversed.

Amplifiers 58b and 60b act as buffers in the presence of both positive and negative going PAM signals in that they prevent the signal current from affecting the voltages developed across diodes D1 and D2. The voltages developed across diodes D1 and D2 should not change when PAM samples appear at junction 62 as these are reference voltages. It should be appreciated that as the diodes voltages are related to the bias currents generated by sources 58a and 60a that buffer amplifiers 58b and 60b also prevent the signal current from affecting these sources.

The voltage at junction 62 in the presence of a bipolar uncompressed PAM signal will vary as shown by equation (6) as a function of the signal strength. In the absence of any corrective signals injected into junction 62 the external current, $i_x$, flowing into or out of the junction in the presence of PAM samples will not be proportional to the sample amplitude. It is, however, desirable that there appear at junction 62 a current source whose current is directly proportional to the PAM sample amplitude. This current source will allow the total current at junction 62 to be independent of the voltage of the load connected to the junction.

It is also desirable, as will be explained in more detail below, that the voltage at junction 62 be modified by feeding back to the junction a current proportional to the compressor output voltage. This feedback current allows the compressor to make a close fit to the piecewise linear approximation to the mu255 characteristic by correcting for the distortion at the zero crossover point. As this feedback current modifies the junction voltage its effect must also be compensated for by the desired junction current source.

Finally as can be seen from equation (6) the signal voltage at junction 62 varies as a function of temperature even if the signal current remains constant in amplitude. Thus, it is desirable to compensate the junction voltage such that the compressor output voltage is independent of temperature.

The desired junction current source, the feedback current for approximating the compressor characteristic and the temperature compensation are provided respectively by negative resistance circuit 64, feedback circuit 66 and temperature compensation circuit 68 shown in FIG. 3. Referring once again to FIG. 3 the operation of these circuits will now be explained in detail.

Negative resistance circuit 64 serves to provide at junction 62 a compensating current such that the junction current, $i_x$, is directly proportional to the PAM sample amplitude. Circuit 64 also compensates for the current fed back to junction 62 by feedback circuit 66.

Feedback circuit 66 comprises a resistor R5 having one end connected to junction 62 and the other end connected to the output of compressor 14. The signal fed back by resistor R5 to junction 62 is proportional to the compressor's output voltage. The feedback signal modifies the voltage at junction 62 in a manner such that a close approximation to the mu255 characteristic is obtained. The mu255 characteristic is a logarithmic function which is expressed as:

$$y = \frac{\ln(1 + 255x)}{\ln 256} \quad 0 \leq x \leq 1 \quad (7)$$

Quite typically the characteristic is implemented by circuitry which provides a piecewise linear approximation to the logarithmic characteristic. The current fed back by circuit 66 allows the compressor of the present invention to make a close fit to the piecewise linear approximation.

The current fed back to junction 62 by circuit 66 also effects the voltage at the junction. Thus, negative resistance circuit 64 must not only compensate for the variation of junction voltage with signal strength but also for the effect that the feedback current has on the junction voltage.

Negative resistance circuit 64 comprises operational amplifier A1 having its inverting input terminal connected to ground by a resistor R2 and to the amplifier's output by an adjustable resistor R3. The amplifier has its noninverting input terminal connected to its output by a resistor R4. With the compressor input voltage designated as $V_{IN}$, the compressor output voltage designated as Vout, the junction voltage as V and designating the resistance of circuit 64 as $R_N$, it may be shown that in the presence of the feedback current provided by circuit 66 the current $i_x$ at junction 62 is expressed as:

$$i_x = \frac{V_{IN} - V}{R_1} + \frac{V_{out} - V}{R_5} - \frac{V}{R_N} \quad (8)$$

$$= \frac{V_{IN}}{R_1} + \frac{V_{out}}{R_5} + V\left(-\frac{1}{R_1} - \frac{1}{R_5} - \frac{1}{R_N}\right) \quad (8a)$$

Elimination of V in the above equation allows the current $i_x$ to be independent of the load voltage. This is the definition of a current source. By so eliminating V the resistance of the negative resistor $R_N$ may be expressed as:

$$R_N = \frac{1}{\frac{1}{R_1} + \frac{1}{R_5}} = -\frac{R_1 R_5}{R_1 + R_5} \quad (9)$$

Thus circuit 64 must simulate a negative resistor whose resistance is equal to the resistance of the parallel combination of resistors R1 and R5.

In order that circuit 64 simulate a negative resistor the gain of operational amplifier A1 must be such the resistance seen looking into circuit 64 is negative. The gain, G, of amplifier A1 may be expressed as (R2+R3)/R2. The resistance, $R_N$, seen looking into circuit 64 may be expressed as:

$$R_N = \frac{R_4}{1 - G} = -\frac{R_2 R_4}{R_3} \quad (10)$$

A negative resistor is unstable. As the simulated negative resistor $R_N$ has a resistance magnitude which is equal to the parallel combination of resistors R1 and R5 the possibility of instability exists, unless the negative resistor is placed in parallel with sufficient positive resistance such that the overall combination is positive. The total impedance of diodes D3 and D4 which range from about 5,000 ohms at no load to about 50 ohms at full load provide the additional positive resistance such that the overall combination of RN, R1, R5 and the diode resistances are positive and therefore stable. At no load the total impedance of the diodes is the parallel combination of the individual diode impedances and at full load the total impedance is equal to the impedance of one of the diodes, the other being cut off.

It should be appreciated that negative resistance circuit 64 is needed in compressor 14 because the input signal to the compressor is a voltage. If the input signal to the compressor were a current then the current at junction 62 would vary directly as a function of the PAM signal amplitude and circuit 64 would not be needed.

Temperature compensation circuit 68 serves to compensate for the variation of the voltage at junction 62 with temperature. As shown by equation (6) the voltage at junction 62 in the presence of uncompressed PAM samples varies directly with temperature. Thus, in the absence of any compensation the compressor output voltage will also vary with temperature.

Circuit 68 comprises an operational amplifier A2, having its noninverting input connected to junction 62 and its inverting input connected to its output through an adjustable resistor R6. The inverting input is also connected to ground through the series combination of a resistor R7 and a thermal resistor (thermistor) R8. The gain, G, of amplifier A2 (from junction 62 to the compressor output) may be expressed as:

$$G = 1 + \frac{R_6}{R_7 + R_8} \tag{11}$$

Proper selection of resistance values for resistors R6 and R7 and for thermistor R8 allows the gain of A2 to change with temperature in a manner so as to compensate for the variation with temperature of the signal voltage of junction 62. It should be appreciated that diodes D3 and D4 and thermistor R6 are all located on the same circuit board and are thus at the same temperature.

Thus, negative resistance circuit 64, feedback circuit 66 and temperature compensation circuit 68 act in combination to thereby aid the compressor of the present invention in generating at its output a voltage which is independent of temperature and having a compression characteristic which is a close fit to the piecewise linear approximation to the mu255 characteristic.

Representative component values for a compressor constructed according to the present invention are given below:

$R_1 = 9090$ ohms in parallel with $75.0 \times 10^3$ ohms;
$R_2 = 1000$ ohms;
$R_3 = 10 \times 10^3$ ohms nominal—is adjustable;
$R_4 = 73.2 \times 10^3$ ohms;
$R_5 = 80.6 \times 10^3$ ohms;
$R_6 = 6330$ ohms nominal—is adjustable;
$R_7 = 499$ ohms;
$R_8 = 500$ ohms (thermistor);
$R_9 = 2.21 \times 10^6$ ohms;
$R_{10} = 2.21 \times 10^6$ ohms.

Figure 5:
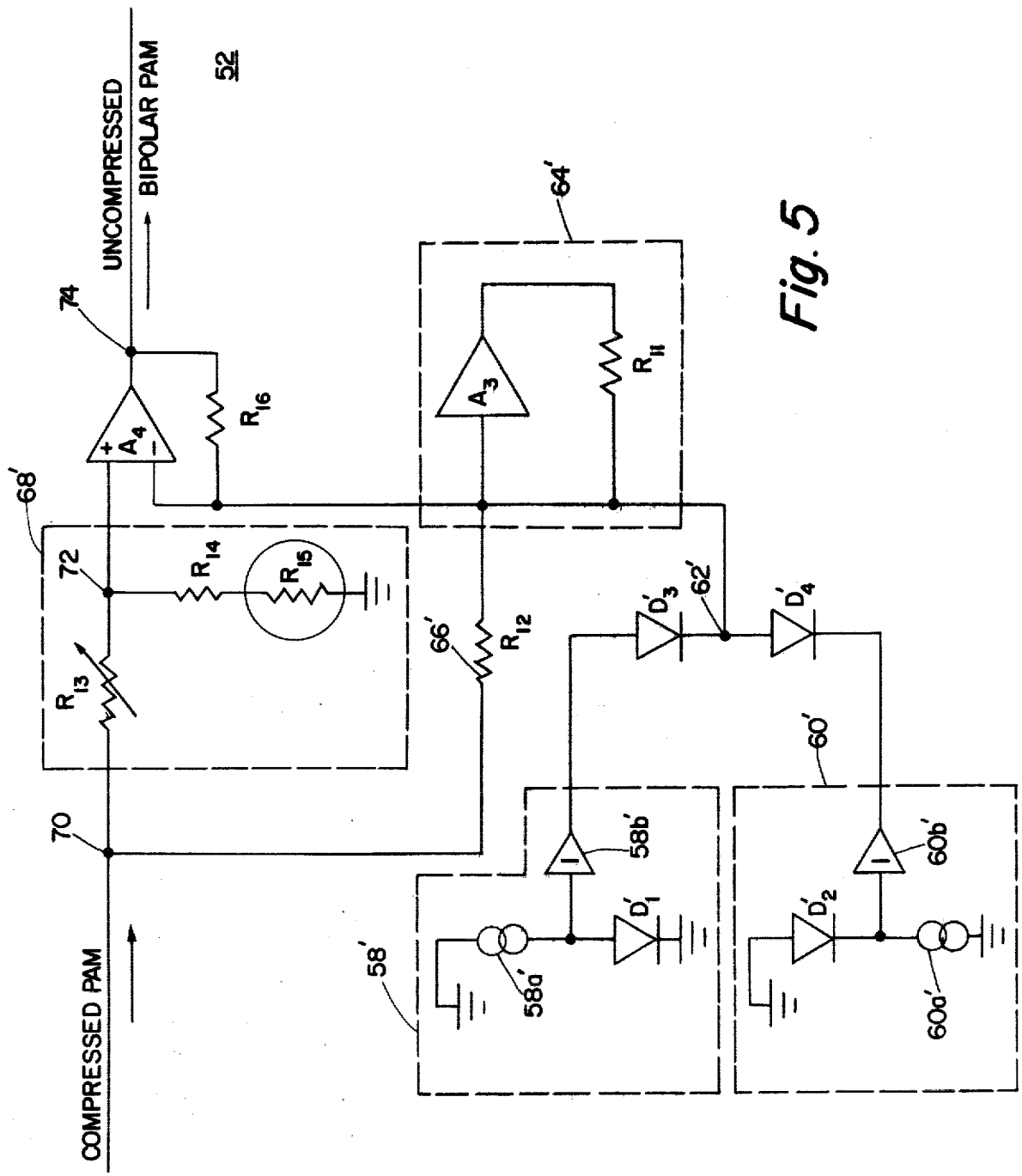
FIG. 5 is a schematic diagram which illustrates one embodiment of the invention as applied to an expandor for bipolar signals.

Referring to FIG. 5 there is shown a simplified schematic diagram of expandor 52 of FIG. 2 according to the present invention. Expandor 52 has an expansion characteristic which is the complement of the compression characteristic of compressor 14. The expandor functions in a manner such that compressed PAM signals at its input are expanded to uncompressed PAM signals at its output. The uncompressed PAM signals are substantially equal in amplitude to the uncompressed PAM signals appearing at the input to compressor 14.

Expandor 52 uses the logarithmic characteristics of diodes in generating its expansion characteristic. As in the compressor, the expandor utilizes negative resistance, distortion correction and temperature compensation to thereby allow the expandor output voltage to be independent of temperature and the expansion characteristic to be a close fit to the piecewise linear approximation to the complement of the mu255 characteristic. In expandor 52 bias sources 58' and 60', diodes D3' and D4', negative resistance circuitry 64' and temperature compensation circuitry 68' each function, as described below, in a manner similar to the corresponding circuitry of compressor 14. Distortion correction circuit 66' functions in a manner similar to feedback circuit 66 with the exception that it feeds a sample of the expandor input signal to junction 62' whereas circuit 66 feeds a sample of the compressor output signal to junction 62.

Bias sources 58' and 60' and diodes D3' and D4' function in a manner identical to the similarly designated components of compressor 14 (FIG. 3). Diodes D1' and D2' of sources 58' and 60' and diodes D3' and D4' may be implemented as shown in FIG. 4 by using four matched transistors and connecting the collector and base of each transistor together to thereby form a diode. Further, current sources 58a' and 60a' may each be implemented as shown in FIG. 4 by connecting a resistor to a source of voltage with source 58a' having its resistor connected to a source of positive d-c voltage +Vs and source 60a' having its resistor connected to a source of negative d-c voltage −Vs.

As in the compressor, the sum of the voltages from the anode of diode D1' to the cathode of diode D2' is always equal to the sum of the voltages from the anode of diode D3' to the cathode of diode D4'. The voltages across diodes D1' and D2' are always equal and opposite whether or not signal is present. The voltages across diodes D3' and D4', while equal and opposite in the idle condition redistribute themselves in the presence of signal but always in a manner such that their sum is equal to the sum of the voltages across D1' and D2'. Unity gain amplifiers 58b' and 60b' act as buffers to prevent the current in diodes D3' and D4' in the presence of signal from affecting the currents generated by sources 58a' and 60a' and the voltages across D1' and D2'.

As in the compressor, negative resistance circuit 64' simulates a negative resistance such that the signal current at junction 62' is directly proportional to the voltage of the uncompressed PAM samples. Resistor R16 functions in a manner similar to resistor R1 of compressor 14 to provide the signal current into junction 62' in the presence of uncompressed PAM signals. Circuit 64' comprises an operational amplifier A3 having its input and output connected by a resistor R11.

Distortion correction circuit 66', comprising resistor R12, feeds to junction 62' a current proportional to the compressed PAM signal amplitude to thereby allow the expandor to have an expansion characteristic which is a closer fit to the piecewise linear approximation to the mu255 characteristic. As in the compressor the current fed by resistor R12 to junction 62' corrects for the distortion in the approximation to the companding characteristic which occurs at the characteristic's zero crossing point.

Thus, in a manner similar to the corresponding circuit in the compressor, negative resistance circuit 64' injects into junction 62' a current which not only allows the signal current at the junction to be directly proportional to the uncompressed PAM sample amplitude but also compensates for the current fed to the junction by distortion correction circuit 66'.

Temperature compensation circuit 68', comprising adjustable resistor R13 having one end connected to expandor input terminal 70 and the other end connected at junction 72 to the series combination of resistor R14 and thermal resistor R15, provides compensation for the temperature dependent characteristic of diodes D3' and D4'. In this manner, expandor 52 is insensitive to variations of temperature.

Resistors R13, R14 and R15 also act as voltage dividers. The resistors divide the compressed PAM signal voltage appearing at expandor input 70 such that the voltage at junction 72, and at the noninverting input terminal of operational amplifier A4 to which the junction is connected, is equal to the voltage of junction 62 of compressor 14. By the action of resistor R16 the voltage at the non-inverting input terminal of amplifier A4 also appears at the amplifiers inverting input terminal and therefore at junction 62'. Thus, the voltage at expandor junction 62' is equal to the voltage at compressor junction 62.

It may be shown that the current into resistor R16 of the expandor is equal to the current into resistor R1 of the compressor. As the voltage at compressor junction 62 is equal to the voltage at expandor junction 62', it therefore follows that if resistors R1 and R16 are of equal resistance then the output voltage of the expandor is substantially equal to the input voltage to the compressor. In other words, the voltage of the uncompressed PAM signals appearing at the output of expandor 52 is substantially equal (except for the quantization noise) to the voltage of the uncompressed PAM signals appearing at the input to compressor 14.

It should be appreciated that compressor 14 and its companion expandor 52 are typically located in different environments. For example, the compressor may be located indoors at a telephone central office and its companion expandor may be located outdoors at a subscriber terminal. Thus, as compressor 14 and expandor 52 each separately compensate for variations in temperature, such variations will not in any manner affect the PAM samples as they are compressed in transmitter 10 (FIG. 1) and expanded in receiver 34 (FIG. 2).

Referring to FIG. 6 there is shown a schematic diagram representing an exemplary embodiment for negative resistance circuit 64', and the combination of operational amplifier A4 and resistor R16 of FIG. 5. As shown in FIG. 5 circuit 64' and amplifier A4 and resistor R16 are connected between junction 62' of expandor 52 and the expandor's input and output terminals 70 and 74 respectively. The exemplary embodiment shown in FIG. 6 is also connected between junction 62' and terminals 70 and 74 of expandor 54. Thus circuits 64' and amplifier A4 and resistor R16 of FIG. 5 may be embodied by the combination of operational amplifiers A5, A6 and A7 and associated resistors shown in the exemplary embodiment of FIG. 6.

Operational amplifier A5 has its noninverting input connected to junction 72. The noninverting input is also connected to junction 62' by the series combination of capacitor C1 and resistor R25. This series combination of C1 and R25 provides frequency compensation to thereby increase circuit stability. A resistor R17 is connected between the inverting input of amplifier A5 and ground. A resistor R18 is connected between the inverting input of the amplifier and the amplifier's output and a resistor R19 is connected between the amplifier output and junction 62'. Amplifier A5 in combination with resistors R17, R18 and R19 simulates a negative resistor to thereby act as a current source for the corrective current injected into junction 62'. Thus amplifier A5 and resistors R17,R18 and R19 function in a manner identical to amplifier A3 and resistor R11 of FIG. 5.

In the exemplary embodiment of FIG. 6 amplifier A4 and resistor R16 of FIG. 5 are represented by the combination of operational amplifiers A6 and A7 and their associated resistors. In theory it should be possible to use a single operational amplifier A4 in combination with a resistor 16 as shown in FIG. 5 to provide the connection between junction 72 and junction 62' such the voltage at both junctions are equal. Because of band width limitations in operational amplifiers it is not possible to utilize a single operational amplifier in this manner. Thus, the desired combination of a single operational amplifier A4 and resistor R16 is simulated through the use of the two operational amplifiers A6 and A7 and associated resistors shown in the exemplary embodiment of FIG. 6.

Resistor R20 of the exemplary embodiment of FIG. 6 functions in a manner similar to resistor R1 shown in the schematic diagram of FIG. 3 for compressor 14. In the exemplary embodiment shown in FIG. 6, resistor R20 is selected to have a resistance which is less than the resistance of resistor R1. For a given sample current the voltage developed across resistor R20 is less than the voltage developed across R1 and is related to the voltage developed across resistor R1 by the ratio of the resistance of the two resistors.

Operational amplifier A6 has its noninverting input connected to junction 72. The inverting input of amplifier A6 is connected to junction 62' and also by resistor R20 to the amplifier's output. The output of amplifier A6 is connected by resistor R21 to the inverting input of amplifier A7. As described previously resistors R13, R14 and R15 function in a manner such that the voltage appearing at the noninverting input of amplifier A6 is equal to the voltage of the uncompressed PAM signals appearing at junction 62 of compressor 12. For a given sample current the voltage appearing at the output of amplifier A6 is equal to the sum of the voltage at junction 72 and the voltage developed across resistor R20 by the sample current. The voltage appearing at expandor output terminal 74 should, however, be substantially equal to the voltage appearing at the input to the compressor 12. The voltage at the compressor input is equal to the sum of the voltage appearing at junction 62 and the voltage developed by the sample current across resistor R1. Thus as the voltage developed across resistor R20 is less than the voltage developed across R1 additional voltage must appear at the noninverting input to amplifier A7 in order that the expandor output voltage be equal to the compressor input voltage.

Amplifier A7 has its inverting input terminal connected to its output by resistor R22. The noninverting input terminal of amplifier A7 is connected through resistor R23 to ground and through adjustable resistor R24 to the output of amplifier A5. In the exemplary embodiment of FIG. 6 representative component values for resistors R23 and R24 are selected in a manner such that the required additional voltage needed to make the expandor output voltage equal to the compressor input voltage appears at the noninverting input to amplifier A7. Amplifier A7 provides an expandor output voltage which is equal to the sum of the voltages at its noninverting and inverting input terminals. Therefore, amplifiers A6 and A7 and their associated resistors function in a manner which is equivalent to the function that would be provided by the combination of the single operational amplifier A4 and resistor R16 shown in FIG. 5. Thus expandor 52 functions in a manner to provide at its output a temperature compensated voltage which is substantially equal to the voltage at the input to compressor 14 and to further provide an expansion characteristic which is a close fit to the piecewise linear approximation to the mu255 characteristic.

Representative component values for the resistors comprising negative resistance circuit 64', distortion correction circuit 66', temperature compensation circuit 68' and resistor R16 constructed according to the present invention are given below:

$R_{12} = 80.6 \times 10^3$ ohms;
$R_{13} = 6330$ ohms nominal—is adjustable;
$R_{14} = 499$ ohms;
$R_{15} = 500$ ohms (thermistor);
$R_{17} = 1000$ ohms;
$R_{18} = 10.0 \times 10^3$ ohms;
$R_{19} = 73.2 \times 10^3$ ohms;
$R_{20} = 1000$ ohms;
$R_{21} = 511$ ohms;
$R_{22} = 3320$ ohms;
$R_{23} = 412$ ohms;
$R_{24} = 5360$ ohms nominal—is adjustable.

While the present invention has been described in connection with a compressor and expandor for bipolar PAM signals it should be appreciated that it may also be used in connection with a compressor and expandor for unipolar PAM signals. In the circuit of FIG. 1 unipolar PAM signals may be generated at the input to compressor 14 by including in the circuit between the output of analog multiplexer 12 and compressor 14 a suitable fullwave rectifier circuit (not shown) including a polarity detector. The term unipolar is used herein to indicate that the PAM signal applied to the compressor may be comprised of pulses which are all positive or all negative depending on the type of rectifier used. The polarity detector generates a polarity indicating signal to A/D converter 22. The signal is representative of the polarity of the PAM signal prior to rectification. The polarity indicating signal may, for example, be a one if the bipolar PAM sample is positive and a zero if the bipolar PAM sample is negative. The A/D converter utilizes the polarity indicating signal so as to ensure that the compressed unipolar PAM samples are encoded into the proper PCM signal format. A simplified schematic diagram of a unipolar compressor according to the present invention for compressing positive unipolar PAM signals is shown in FIG. 7.

Figure 7:
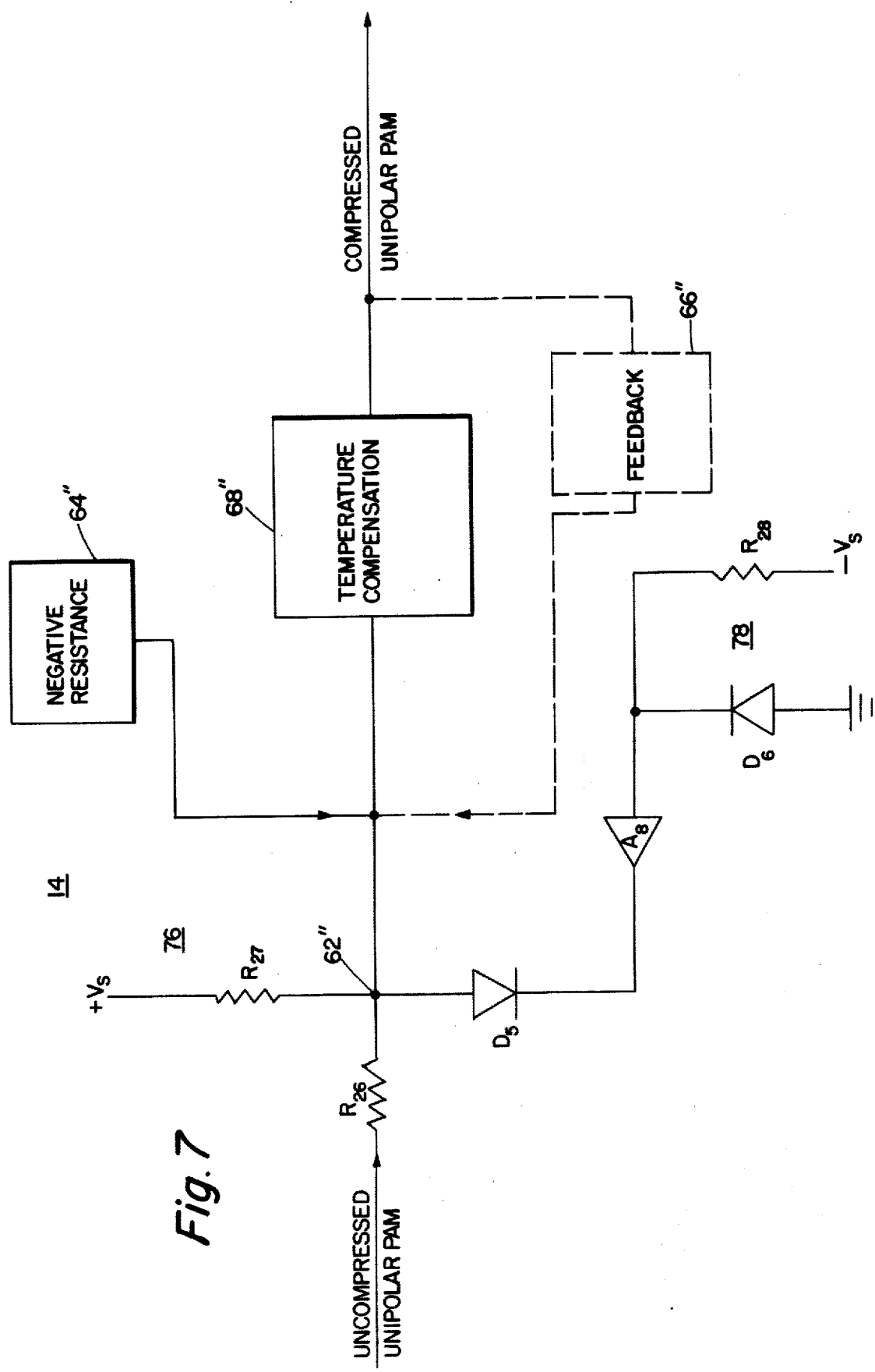
FIG. 7 is a combined block-schematic diagram which illustrates one embodiment of the invention as applied to a compressor for unipolar signals.

Referring to FIG. 7 the unipolar compressor includes input resistor R26, first and second bias sources 76 and 78, diodes D5 and D6, buffer amplifier A8, negative resistance circuit 64" and temperature compensation circuit 68". It may also be desirable as discussed hereinafter to provide in the unipolar compressor a feedback circuit 66" shown in dotted lines in FIG. 7. Detailed circuit schematics for circuits 64", 66" and 68" are not shown as these circuits are and function in a manner identical to the similarly unprimed numbered circuits shown in FIG. 3, described previously. First bias source 76, input resistor R26 and diode D5 are connected together at junction 62".

In the absence of unipolar uncompressed PAM signals (the idle condition) the voltage at junction 62" should be zero. Source 76 provides through a resistor R27 connected between the junction and a source of positive voltage +Vs a current which is equal in magnitude and opposite in sign to the current provided by source 78. Source 78 comprises a resistor R28 having one end connected to a source of negative voltage —Vs and the other end connected through a unity gain amplifier A8 which acts as a buffer to the cathode of diode D5. The anode of diode D5 is connected to junction 62". A diode D6 has its cathode connected to the junction of the resistor R28 and amplifier A8 and its anode connected to the ground.

In order that the voltage at junction 62" may be zero in the idle condition it is necessary that diodes D5 and D6 be matched. In the idle condition the bias currents developed by source 76 and 78 flow through diodes D5 and D6, respectively. If the diodes are matched and the bias currents are equal in magnitude then the voltages developed across the diodes will also be equal in magnitude. As the diodes are oppositely poled the sum of the diode voltages, i.e. the voltage between junction 62" and ground, will be zero. Equal magnitude bias currents may be generated by sources 76 and 78 by having the voltages +Vs and —Vs equal in magnitude and having the resistors R27 and R28 be of equal resistance. By using a chip type such Motorola type MC 3346 which contains multiple transistors and by connecting together a transistor's collector and base, a suitable number of matched diodes may be obtained.

The voltage V at junction 62" may be expressed as:

$$V = V_{D5} - V_{D6} \approx \frac{KT}{q} \ln \frac{i_{D5}}{I_A} \qquad (12)$$

where $i_{D5}$ is the current which flows in diode D5 due to a signal and $I_A$ is the fixed bias current provided by sources 76 and 78.

In the idle condition the current $i_{D5}$, is equal to $I_A$. Thus in the idle condition the voltage at junction 62" is zero.

For positive going unipolar uncompressed PAM signals appearing at the input to the compressor a signal current, $i_x$, flows through resistor R26 and into junction 62". The current in diode D5 in the presence of signal may be expressed as:

$$i_{D5} = i_x + I_A \qquad (13)$$

Thus in the presence of signal the current in diode D5 increases. Due to the increased flow of current in diode D5 the voltage at the junction also increases and by substituting equation (13) into equation (12) the junction voltage may be expressed as:

$$V \approx \frac{KT}{q} \ln\left(1 + \frac{i_x}{I_A}\right) \qquad (14)$$

In arriving at the above expressions it has been assumed that the bias current $I_A$ provided by source 78 is much greater than the reverse saturation current Is of diode D5 i.e. $I_A \gg Is$.

Buffer amplifier A8 acts in a manner similar to the buffer amplifier of the bipolar compressor to prevent the signal current from affecting the current generated by source 78 and the voltage developed across diode D6. The current generated by source 78 and the voltage across D6 should not change in the presence of signal current at junction 62" as the source current and diode voltage act as a source of reference current and voltage. The reference bias current generated by source 78 will except for very low amplitude PAM signals be very much smaller than the signal current. Thus in the presence of positive uncompressed unipolar PAM signals and in the absence of any compensation the voltage of junction 62" varies directly as a function of temperature.

In the absence of compensation, variation of the voltage at the junction with temperature will result in a compressor output voltage which also varies with temperature. Compensation for temperature variations is provided by temperature compensation 68" in the same manner as the temperature compensation provided by circuit 68 in the bipolar compressor of FIG. 3. Thus, the operation of temperature compensation circuit 68" need not be described further.

The voltage at junction 62" in the presence of positive unipolar uncompressed PAM signal will vary in accordance with equation (12) as a function of the signal strength. In the absence of any corrective currents injected into the junction the signal current, $i_x$, flowing in the junction in the presence of positive PAM samples is not proportional to the amplitude of the samples. It is, however, desirable that there appear at the junction a current source whose current is directly proportional to the PAM sample amplitude. The current source will allow the total current at the junction to be independent of the voltage of the load connected to the junction and thereby allow the signal current to be proportional to the sample amplitude. The desired junction current source is provided by negative resistance circuit 64" in the same manner that negative resistance circuit 64 of FIG. 3 provides the current source for the bipolar compressor. This negative resistance circuit 64" will except for the differences noted below be identical in structure and function to circuit 64.

It may be shown that if circuit 64" simulates a negative resistor, $R_N$, having a resistance equal in magnitude to be resistance of resistor R26 then the current $i_x$ is independent of the load voltage. A negative resistor is unstable. The possibility of instability exists unless the negative resistor is placed in parallel with sufficient positive resistance such that the overall combination is positive. The impedance of diode D5 which ranges from about 10,000 ohms at no load to about 50 ohms at full load provides the additional positive resistance such that the combination of RN, R26 and the diode resistance is positive and therefore stable.

It should be appreciated that negative resistance circuit 64" is needed in the unipolar compressor because the input signal to the compressor is a voltage. If the input signal to the compressor where a current, then the current at junction 62" would vary directly as a function of the PAM signal amplitude and circuit 64" would not be needed.

As described above the junction voltage varies logarithmically with signal current. The compression characteristic of the unipolar compressor should follow the "mu" law which is also a logarithmic function. Quite typically the characteristic is implemented by circuitry which provides a piecewise linear approximation to the logarithmic characteristic. Thus, proper selection of compressor circuit components allows the unipolar compressor of FIG. 7 to be designed so as to very closely follow the actual "mu" law characteristic.

In the event that circuit components which allow the close fit to the desired logarithmic companding characteristic are not available a close fit may be obtained by feeding back to junction 62" a current proportional to the voltage at the compressor output. Feedback circuit 66" is connected between the compressor output and junction 62" to provide in the same manner as feedback circuit 66 of FIG. 3 the feedback signal to the junction. Circuit 66" is identical in structure to and functions in a manner similar to circuit 66. Thus, the operation of feedback circuit 66" need not be described further.

The current fed back to junction 62" is proportional to the compressor output voltage and allows the compressor to make a close fit to the desired logarithmic companding characteristic particularly in the lower region of the characteristic. The feedback current modifies the junction voltage and therefore the effect of feedback must also be compensated for by negative resistance circuit 64". It may be shown that the effects of feedback can be compensated for by a negative resistor RN having a resistance magnitude which is equal to the parallel combination of compressor intput resistor R26 and the feedback resistor. Thus, in the presence of feedback the magnitude of the negative resistor must be decreased in order that the effect such feedback has on junction 62" may be compensated for.

While the circuit shown in FIG. 7 may be used to compress positive unipolar PAM signals it may be desirable to also be able to compress negative unipolar PAM signals. A compressor for negative unipolar signals may be designed from the circuit shown in FIG. 7 by simply reversing the polarities of diodes D5 and D6 and the polarities of the voltage sources connected to resistor R27 and R28. Thus, a negative unipolar compressor would have a diode D5 with its cathode connected to junction 62", a diode D6 with its cathode connected to ground, a resistor R27 being connected to a source of negative voltage $-V_s$ and a resistor R28 being connected to a source of positive voltage $+V_s$.

It may also be desirable for certain applications to use the combination of one positive and one negative unipolar compressor to provide compression rather than a single positive or negative compressor as described above. For such applications a positive or negative half wave rectifier would have to be used in the circuit of FIG. 1 in place of the fullwave rectifier described above.

After compression the signals out of the positive and negative compressors would then be recombined using suitable circuitry to thereby provide at the input of A/D converter 22 a compressed bipolar PAM signal.

It should further be appreciated that a companion positive or negative unipolar expandor may be provided according to the present invention by reconfiguring the expandor circuit shown in FIG. 5 so that it responds only to positive or negative compressed PAM signals but not both. The manner in which the circuit of FIG. 5 is reconfigured would be similar to the reconfiguration of the bipolar compressor of FIG. 3 in arriving at the unipolar compressor of FIG. 7. For the unipolar expandor a suitable full wave rectifier and polarity detector would have to be provided between the output of D/A converter 50 and the input to the expandor. The output of the polarity detector would then be used by demultiplexer 56 to provide the proper polarity uncompressed PAM signals to each of channels 1 to N.

It is to be understood that the descriptions of the preferred embodiments are intended to be only illustrative, rather than exhaustive, of the present invention. Those of ordinary skill will be able to make certain additions, deletions, and/or modifications to the embodiments of the disclosed subject matter without departing from the spirit of the invention or its scope, as defined by the appended claims.

What is claimed is:

1. A compressor having an input and an output and a junction point intermediate there between for compressing in accordance with a predetermined logarithmic encoding characteristic a variable amplitude analog input signal to thereby generate at said output a temperature independent compressed analog signal which substantially follows said encoding characteristic comprising:
  (a) first source means for generating independent of said input signal amplitude a constant amplitude first current and including a first conductive means having a temperature dependent logarithmic conduction characteristic for generating in response to said first current a first temperature dependent voltage;
  (b) first circuit means connected to said junction point for generating a second current which is equal in magnitude to said first current when said input signal amplitude is zero;
  (c) means connected between said input and said junction for generating at said junction point a signal proportional to said compressor input signal;
  (d) second conductive means connected between said first source means and said junction point, said second conductive means having a temperature dependent logarithmic conduction characteristic and being matched to said first conductive means for generating in response to said junction point input signal and said second current a second temperature dependent voltage, the voltage at said junction point being equal to the difference between said first and second voltages, said second voltage being equal to said first voltage when said input signal amplitude is zero; and
  (e) temperature compensation means connected between said junction point and said compressor output having a temperature sensitive gain characteristic for compensating the temperature dependent voltage generated at said junction point to thereby generate said compressor output signal.

2. The compressor of claim 1 wherein said first circuit means includes second source means having a fixed voltage for generating said second current.

3. The compressor of claim 1 wherein said first circuit means includes second source means for generating independent of said input signal amplitude said second current and including third conductive means having a temperature dependent logarithmic conduction characteristic for generating in response to said second current a third temperature dependent voltage.

4. The compressor of claim 3 wherein said first circuit means further includes fourth conductive means connected between said second source means and said junction point, said fourth conductive means having a temperature dependent logarithmic conduction characteristic and being matched to each of said first, second and third conductive means for generating in response to said junction point input signal and said first current a fourth temperature dependent voltage, the voltage at said junction point being equal to the difference between said third and fourth voltages, said third voltage being equal to said fourth voltage when said input signal amplitude is zero, the sum of said first and second voltage always being equal to the sum of said third and fourth voltages.

5. The compressor of claim 2 or 4 wherein said compressor input signal is a voltage, said connecting means is a resistor and said junction point input signal is a current.

6. The compressor of claim 5 further including means connected to said junction point for simulating at said point a resistor having a value of negative resistance sufficient to make said junction point input signal current directly proportional to said compressor input signal.

7. The compressor of claim 5 further including means connected between said junction point and said compressor output for feeding back to said junction point a signal proportional to said compressor output signal.

8. The compressor of claim 7 further including means connected to said junction point for simulating a resistor having a value of negative resistance sufficient to make said junction point input signal current directly proportional to said compressor input signal.

9. The compressor of claim 8 wherein said feedback means is a resistor and said negative resistance has a magnitude which is a function of the said parallel combination of the resistance of said input connecting resistor and said feedback resistor.

10. The compressor of claim 1 or 2 wherein each of said first and second conductive means are diodes.

11. The compressor of claim 4 wherein each of said conductive means are diodes.

12. A compressor having an input and an output and a junction point intermediate therebetween for compressing in accordance with a predetermined logarithmic encoding characteristic a variable amplitude bipolar analog input signal to thereby generate at said output a temperature independent compressed analog signal which substantially follows said encoding characteristic comprising:
  (a) first source means for generating independent of said input signal amplitude a constant amplitude first source current and including a first conductive means having a temperature dependent logarithmic conduction characteristic for generating in response to said first current a first temperature dependent voltage;
  (b) second source means for generating independent of said input signal amplitude a constant amplitude second source current and including a second conductive means having a temperature dependent logarithmic conduction characteristic and being matched to said first conductive means for generating in response to said second current a second temperature dependent voltage, said first and second source currents being equal in magnitude and first and second voltages always being equal in magnitude and opposite in sign;
  (c) means connected between said input and said junction for generating at said junction point a signal proportional to said compressor input signal;
  (d) third conductive means connected between said first source means and said junction point, said third conductive means having a temperature dependent logarithmic conduction characteristic and being matched to said first conductive means for generating in response to said junction point input signal when said signal is positive and said source current a third temperature dependent voltage, the voltage at said junction point being equal to the difference between said first and third voltages, said third voltage being equal to said first voltage when said input signal amplitude is zero;
  (e) fourth conductive means connected between said second source means and said junction point, said fourth conductive means having a temperature dependent logarithmic conduction characteristic and being matched to said second conductive means for generating in response to said junction point input signal when said signal is negative and said source current a fourth temperature dependent voltage, the voltage at said junction point being equal to the difference between said second and fourth voltages, said second voltage being equal to said fourth voltage when said input signal amplitude is zero, the sum of said first and second voltages always being equal to the sum of said third and fourth voltages; and (f) temperature compensation means connected between said junction point and said compressor output having a temperature sensitive gain characteristic for compensating the temperature dependent voltage generated at said junction point to thereby generate said compressor output signal.

13. The compressor of claim 12 wherein said compressor input signal is a voltage, said connecting means is a resistor and said junction point input signal is a current.

14. The compressor of claim 13 further including means connected to said junction point for simulating at said point a resistor having a value of negative resistance sufficient to make said junction point input signal current directly proportional to said compressor input signal.

15. The compressor claim 13 further including means connected between said junction point and said compressor output for feeding back to said junction point a signal proportional to said compressor output signal.

16. The compressor of claim 15 further including means connected to said junction point for simulating a resistor having a value of negative resistance sufficient to make said junction point input signal current directly proportional to said compressor input signal.

17. The compressor of claim 16 wherein said feedback means is a resistor and said negative resistance has a magnitude which is a function of the said parallel combination of the resistance of said input connecting resistor and said feedback resistor.

18. The compressor of claim 12 wherein each of said conductive means are diodes.

19. An expandor having an input and an output and a junction point intermediate therebetween for expanding an analog input signal, which has been compressed in accordance with a predetermined logarithmic compression characteristic, in accordance with a predetermined logarithmic expansion characteristic substantially the complement of said compression characteristic to thereby generate at said output a temperature independent uncompressed analog signal comprising:

(a) first source means for generating independent of said input signal a constant amplitude first current and including a first conductive means having a temperature dependent logarithmic conduction characteristic for generating in response to said first current a first temperature dependent voltage;

(b) first circuit means connected to said junction for generating a second current which is equal in magnitude to said first current when said input signal is zero;

(c) means connected between said input and said junction having a temperature sensitive characteristic for generating at said junction a temperature dependent voltage proportional to said expandor input signal;

(d) second conductive means connected between said first source means and said junction point, said second conductive means having a temperature dependent logarithmic conduction characteristic matched to said first conductive means for generating when said input signal is zero a second voltage which is equal and opposite to said first voltage and for generating in response to said temperature dependent junction voltage a third current; and (e) means responsive to said temperature dependent junction voltage and said third current for generating said uncompressed output signal.

20. The expandor of claim 19 wherein said first circuit means includes second source means having a fixed voltage for generating said second current.

21. The expandor of claim 19 wherein said first circuit means includes second source means for generating independent of said input signal amplitude said second current and including third conductive means having a temperature dependent logarithmic conduction characteristic for generating in response to said second current a third temperature dependent voltage.

22. The expandor of claim 21 wherein said first circuit means further includes fourth conductive means connected between said second source means and said junction point, said fourth conductive means having a temperature dependent logarithmic conduction characteristic and being matched to each of said first, second and third conductive means for generating in response to said junction point input signal and said first current a fourth temperature dependent voltage, the voltage at said junction point being equal to the difference between said third and fourth voltages, said third voltage being equal and opposite in sign to said fourth voltage when said input signal amplitude is zero, the sum of said first and second voltage always being equal to the sum of said third and fourth voltages.

23. The expandor of claim 20 or 22 further including means connected to said junction point for simulating at said point a resistor having a value of negative resistance sufficient to make said third current directly proportional to said expandor output signal.

24. The expandor of claim 20 or 22 further including means connected between said junction point and said expandor input for feeding to said junction point a signal proportional to said expandor input signal.

25. The expandor of claim 24 further including means connected to said junction point for simulating a resistor having a value of negative resistance sufficient to make said third current directly proportional to said expandor output signal.

26. The expandor of claim 19 wherein each of said first and second conductive means are diodes.

27. The expandor of claim 22 wherein each of said conductive means are diodes.

28. An expandor having an input and an output and a junction point intermediate therebetween for expanding an analog input signal, which has been compressed in accordance with a predetermined logarithmic compression characteristic, in accordance with a predetermined logarithmic expansion characteristic substantially the complement of said compression characteristic to thereby generate at said output a temperature independent uncompressed analog signal comprising:

(a) first source means for generating independent of said input signal a constant amplitude first current and including a first conductive means having a logarithmic conduction characteristic for generating in response to said first current a first temperature dependent voltage;

(b) second source means for generating independent of said input signal a constant amplitude second current and including a second conductive means having a logarithmic conduction characteristic for generating in response to said second current a second temperature dependent voltage, said first and second currents being equal in magnitude;

(c) means connected between said input and said junction having a temperature sensitive characteristic for generating at said junction a temperature dependent voltage proportional to said expandor input signal;

(d) third conductive means connected between said first source means and said junction point, said third conductive means having a temperature dependent logarithmic conduction characteristic matched to said first conductive means for generating when said input signal is zero a third voltage which is equal and opposite to said first voltage and for generating in response to said junction input signal when said signal is positive a third current;

(e) fourth conductive means connected between said second source means and said junction point, said fourth conductive means having a temperature dependent logarithmic conduction characteristic matched to said second conductive means for generating when said input signal is zero a fourth voltage which is equal and opposite to said second voltage and for generating in response to said junction input signal when said signal is negative a fourth current; and (f) means responsive to said temperature dependent junction voltage, said third current and said fourth current for generating said uncompressed output signal.

29. The expandor of claim 28 further including means connected to said junction point for simulating at said point a resistor having a value of negative resistance sufficient to make said third current and said fourth current directly proportional to said expandor output signal.

30. The expandor claim 28 further including means connected between said junction point and said expandor input for feeding to said junction point a signal proportional to said expandor input signal.

31. The expandor of claim 30 further including means connected to said junction point for simulating a resistor having a value of negative resistance sufficient to make said third current and said fourth current directly proportional to said expandor output signal.

32. The expandor of claim 28 wherein each of said conductive means are diodes.

* * * * *